(12) United States Patent
Zhao et al.

(10) Patent No.: US 12,014,801 B2
(45) Date of Patent: Jun. 18, 2024

(54) WORD LINE DRIVER ARRAY AND MEMORY

(71) Applicant: CHANGXIN MEMORY TECHNOLOGIES, INC., Hefei (CN)

(72) Inventors: Yang Zhao, Hefei (CN); Jaeyong Cha, Hefei (CN)

(73) Assignee: Changxin Memory Technologies, Inc., Anhui (CN)

( * ) Notice: Subject to any disclaimer, the term of this patent is extended or adjusted under 35 U.S.C. 154(b) by 142 days.

(21) Appl. No.: 17/814,011

(22) Filed: Jul. 21, 2022

(65) Prior Publication Data
US 2023/0049421 A1  Feb. 16, 2023

(30) Foreign Application Priority Data

Aug. 13, 2021  (CN) .......................... 202110931849.0

(51) Int. Cl.
*G11C 8/14*  (2006.01)
*G11C 8/08*  (2006.01)

(52) U.S. Cl.
CPC . *G11C 8/08* (2013.01); *G11C 8/14* (2013.01)

(58) Field of Classification Search
CPC .............. H10B 12/50; G11C 8/08; G11C 8/14
See application file for complete search history.

(56) References Cited

U.S. PATENT DOCUMENTS

| 7,359,280 | B2 | 4/2008 | Chang et al. | |
|---|---|---|---|---|
| 8,953,407 | B2* | 2/2015 | Yun | G11C 11/4097 365/230.06 |
| 11,289,140 | B2* | 3/2022 | Jeong | G11C 8/08 |
| 11,322,197 | B1* | 5/2022 | Sisodia | G11C 8/08 |
| 2013/0339571 | A1* | 12/2013 | Cernea | G11C 5/025 711/102 |
| 2015/0076612 | A1* | 3/2015 | Maki | H01L 27/0207 257/368 |
| 2023/0030836 | A1* | 2/2023 | Yang | G11C 8/14 |
| 2023/0082248 | A1* | 3/2023 | Yeh | H10B 43/40 365/185.17 |

FOREIGN PATENT DOCUMENTS

TW         201324531 A1     6/2013

OTHER PUBLICATIONS

TW Office Action cited in TW11220221570, mailed Mar. 9, 2023, 7 pages.

* cited by examiner

*Primary Examiner* — Khamdan N. Alrobaie
(74) *Attorney, Agent, or Firm* — Cooper Legal Group, LLC

(57) ABSTRACT

Embodiments of the present application relate to the field of semiconductors, and provide a word line driver array and a memory. The word line driver array at least includes: a first transistor, a third transistor, a fourth transistor and a second transistor arranged sequentially, as well as a fourth word line, a first word line, a second word line and a third word line parallel to each other, wherein the fourth word line is connected to a drain of the fourth transistor, the first word line is connected to a drain of the first transistor, the second word line is connected to a drain of the second transistor, and the third word line is connected to a drain of the third transistor.

14 Claims, 4 Drawing Sheets

WORD LINE DRIVER ARRAY AND MEMORY

CROSS-REFERENCE TO RELATED APPLICATIONS

This application claims the priority of Chinese Patent Application No. 202110931849.0, submitted to the Chinese Intellectual Property Office on Aug. 13, 2021, the disclosure of which is incorporated herein in its entirety by reference.

TECHNICAL FIELD

Embodiments of the present application relate to the field of semiconductors, and in particular to a word line driver array and a memory.

BACKGROUND

While progresses have been made in science and technology, integrated circuit (IC) structures are getting more miniaturized, causing smaller sizes of components and smaller spacings between adjacent components in the IC structures. With the gradual decrease in spacings between adjacent components, other elements connected to special components have smaller process margins for fear of short circuits, such that the elements are more difficultly manufactured and the electrical properties of the elements are hardly improved. Meanwhile, with the gradual decrease in the spacing between adjacent components, the adjacent components are more susceptible to each other, for example in electromagnetic influence and stress influence.

SUMMARY

In an aspect, an embodiment of the present application provides a word line driver array, including: a first transistor, a third transistor, a fourth transistor and a second transistor arranged sequentially, as well as a fourth word line, a first word line, a second word line and a third word line parallel to each other, wherein the fourth word line is connected to a drain of the fourth transistor, the first word line is connected to a drain of the first transistor, the second word line is connected to a drain of the second transistor, and the third word line is connected to a drain of the third transistor.

In another aspect, an embodiment of the present application further provides a memory, including a plurality of the word line driver arrays arranged sequentially, wherein an arrangement direction of the word line driver arrays is the same as an arrangement direction of corresponding word lines.

BRIEF DESCRIPTION OF THE DRAWINGS

One or more embodiments are exemplified by corresponding accompanying drawings, and these exemplified descriptions do not constitute a limitation on the embodiments. The accompanying drawings are not limited by scale unless otherwise specified.

DETAILED DESCRIPTION

The embodiments of the present disclosure are described in detail below with reference to the drawings. Those of ordinary skill in the art should understand that many technical details are proposed in each embodiment of the present disclosure to help the reader better understand the present disclosure. However, even without these technical details and various changes and modifications made based on the following embodiments, the technical solutions claimed in the present disclosure may still be realized.

Figure 1:
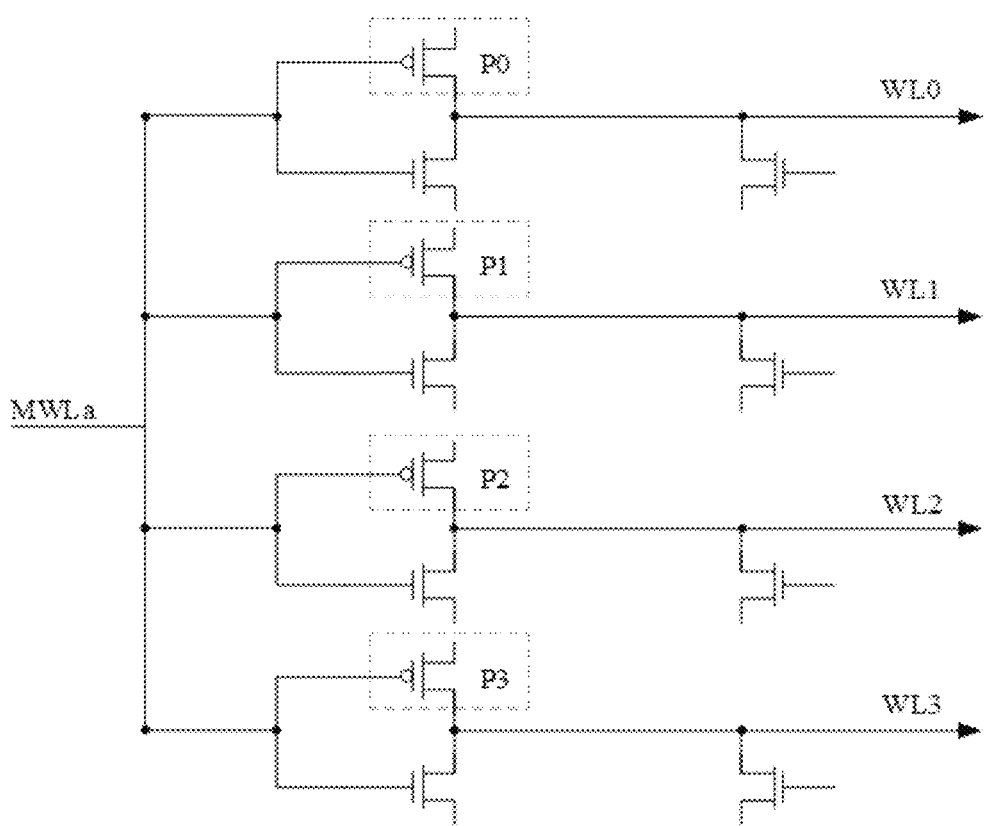
FIG. 1 is a schematic diagram of a circuit structure of a word line driver array according to an embodiment of the present application.
Figure 2:
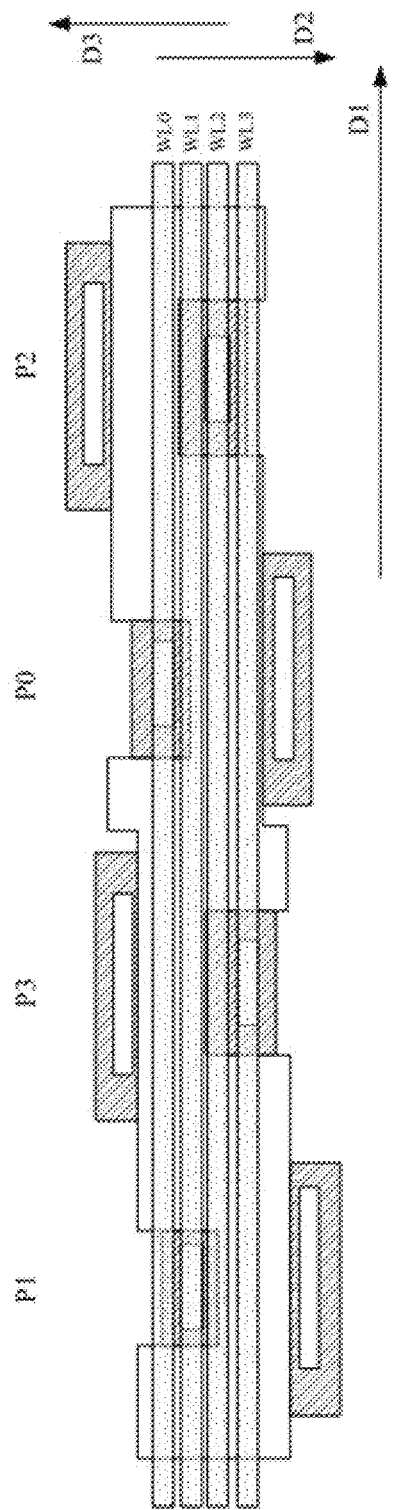
FIG. 2 is a schematic diagram of a layout structure of a word line driver array according to an embodiment of the present application.

FIG. 1 is a schematic diagram of a circuit structure of a word line driver array according to an embodiment of the present application. FIG. 2 is a schematic diagram of a layout structure of a word line driver array according to an embodiment of the present application.

Referring to FIG. 1 and FIG. 2, the word line driver array includes: a first transistor P1, a third transistor P3, a fourth transistor P0 and a second transistor P2 arranged sequentially, as well as a fourth word line WL0, a first word line WL1, a second word line WL2 and a third word line WL3 parallel to each other. The fourth word line WL0 is connected to a drain of the fourth transistor P0. The first word line WL1 is connected to a drain of the first transistor P1. The second word line WL2 is connected to a drain of the second transistor P2. The third word line WL3 is connected to a drain of the third transistor P3.

The embodiments of the present application will be described in more detail below with reference to the accompanying drawings.

Referring to FIG. 1, the embodiment of the present disclosure takes a case where the fourth transistor P0, the first transistor P1, the second transistor P2 and the third transistor P3 each are a positive-channel metal-oxide semiconductor (PMOS) transistor as an example for descriptions. Gates of the fourth transistor P0, the first transistor P1, the second transistor P2 and the third transistor P3 are configured to receive a same control signal, specifically a first control signal MWLa. In other embodiments, the fourth transistor P0, the first transistor P1, the second transistor P2 and the third transistor P3 shown in FIG. 2 each may further be a negative-channel metal-oxide semiconductor (NMOS) transistor.

It is to be noted that different word lines parallel to each other may be parallel curved lines or parallel straight lines. Regardless of the parallel curved lines or the parallel straight lines, the different word lines are neither shorted nor intersected and may coincide with each other through translation in actual circuits. In actual applications, the different word lines may be set as the parallel curved lines or the parallel straight lines according to actual needs. The parallel curved lines and the parallel straight lines can be distinguished based on whether the word lines are straight lines or curved lines, namely whether the word lines need to turn in extension.

In some embodiments, the fourth word line WL0, the first word line WL1, the second word line WL2 and the third word line WL3 are straight lines, namely the word lines unnecessarily turn in extension. In this way, the word lines are prepared more easily and stressed more uniformly in extension, without deformation, crack or even disconnection due to stress concentration and with desirable signal transmission performance. Furthermore, without the non-uniform preparation of the word lines, namely small cross sections of local word lines, it is ensured that the word lines have the small resistance per unit length.

In the embodiments of the present applications, different word lines extend along a first direction D1. The fourth word line WL0, the first word line WL1, the second word line WL2 and the third word line WL3 are arranged along a second direction D2. The first direction D1 is perpendicular to the second direction D2.

In some embodiments, drains of adjacent transistors are staggered in an arrangement direction of the word lines. The word lines are the straight lines, and are electrically connected to drains of corresponding transistors through contact holes. By staggering drains of adjacent transistors in the second direction D2, there are larger spacings between different word lines connected to the adjacent transistors, larger process margins for the word lines and smaller parasitic capacitances between the different word lines, thereby reducing the resistances of the word lines and improving the signal transmission rate of the word lines. It is to be noted that the drains are staggered partially or completely.

In addition, the different word lines connected to the drains of the adjacent transistors are unnecessarily adjacent word lines. For example, WL1 connected to P1 and WL3 connected to P3, WL3 connected to P3 and WL0 connected to P0, and WL0 connected to P0 and WL2 connected to P2 are not adjacent word lines. In a case where the different word lines are not the adjacent word lines, larger spacings are helpful to obtain larger process margins for other middle word lines, and thus the word lines have large cross-sectional areas and small resistances in the extension direction to ensure desirable electrical properties.

In addition, in some embodiments, drains of different transistors arranged at interval are staggered in an arrangement direction of the word lines. The different transistors arranged at interval are further provided therebetween with other transistors. Different word lines connected to the different transistors arranged at interval may be adjacent word lines. For example, WL1 connected to P1 and WL0 connected to P0, and WL3 connected to P3 and WL2 connected to P2 are adjacent word lines. By staggering drains of different transistors arranged at interval, adjacent word lines have the larger process margins, larger cross-sectional areas and larger spacings, and there are a smaller transmission delay and a higher transmission rate between the adjacent word lines.

In some embodiments, the first transistor P1, the third transistor P3, the fourth transistor P0 and the second transistor P2 are sequentially arranged in the first direction D1, and the fourth word line WL0, the first word line WL1, the second word line WL2 and the third word line WL3 are sequentially arranged in the second direction D2. In other words, the first word line WL1 is located between the fourth word line WL0 and the third word line WL3, and the second word line WL2 is located between the first word line WL1 and the third word line WL3.

In some embodiments, a direction that a source of a transistor faces toward a drain of the transistor is recorded as a source-drain orientation of the transistor, and source-drain orientations of adjacent transistors are opposite. Referring to FIG. 2, source-drain orientations of the spaced first transistor P1 and fourth transistor P0 are the third direction D3, and source-drain orientations of the spaced second transistor P2 and third transistor P3 are the second direction D2. The second direction D2 is opposite to the third direction D3.

In some embodiments, gates of the adjacent transistors are at least partially staggered in an arrangement direction of the word lines. The gate of the transistor may be considered as a conductive layer between the source and the drain. By at least partially staggering gates of adjacent transistors, the sources and drains of the transistors can be effectively adjusted, to prevent excessive coincidence of the sources and drains of the adjacent transistors in the second direction D2, and ensure effective connection between the transistors and external components. Exemplarily, referring to FIG. 2, by staggering the gate of P1 and the gate of P3 in the second direction D2, the source and drain of the first transistor P1 can be prevented from excessively coinciding with the source and drain of the second transistor P2 in the second direction D2, and the source of the first transistor P1 and the source of the second transistor P2 can be better connected to external components.

Accordingly, in some embodiments, gates of different transistors arranged at interval are at least partially staggered in the arrangement direction of the word lines. No matter whether the source-drain orientations of adjacent transistors are the same, by at least partially staggering gates of different transistors arranged at interval, excessive coincidence for drains of the different transistors arranged at interval in the second direction D2 is prevented, and different word lines connected to the drains have larger spacings and larger process margins in the second direction D2 to form straight word lines.

Exemplarily, referring to FIG. 2, the drain of the first transistor P1 and the drain of the fourth transistor P0 are staggered in the second direction D2, the WL0 and the WL1 connected to the P0 and the P1 are straight, and the WL0 and the WL1 have larger widths and larger spacings in the second direction D2. The straight word lines prevent the short circuit and open circuit due to turning. The wider word lines increase the cross-sectional areas of the word lines and reduce the resistances of the word lines. The larger spacings between the adjacent word lines suppress parasitic capacitances between the adjacent word lines and ensure desirable signal transmission performance of the word lines.

In some embodiments, two drains of the adjacent transistors are located between two corresponding sources in the arrangement direction of the word lines. Referring to FIG. 2, with adjacent first transistor P1 and third transistor P3 as an example, the drain of the first transistor P1 and the drain of the third transistor P3 are located between the source of the first transistor P1 and the source of the third transistor P3 in the second direction D2. It is to be noted that the embodiment of the present application compares the positional relationships between sources and drains of different transistors in the second direction D2 based on a case where the sources and drains are parallel to a center line of the first direction D1.

In the arrangement direction of the word lines, the drain of the third transistor P3 is located between a source and the drain of the first transistor P1, and the drain of first transistor P1 is located between a source and the drain of the third transistor P3. The drain of the fourth transistor P0 is located between the source and the drain of the third transistor P3, and the drain of the third transistor P3 is located between a source and the drain of the fourth transistor P0. The drain of the second transistor P2 is located between the source and the drain of the fourth transistor P0, and the drain of the fourth transistor P0 is located between a source and the drain of the second transistor P2.

In some embodiments, referring to FIG. 2, in the arrangement direction of the word lines, a gate of the fourth transistor P0 is located between a gate of the first transistor P1 and a gate of the third transistor P3. Further, with same drain sizes of different transistors, the drain of the fourth transistor P0 is located between the drain of the first transistor P1 and the source of the third transistor P3. With same source sizes of different transistors, the source of the fourth transistor P0 is located between the source of the first transistor P1 and the drain of the third transistor P3. The same drain sizes at least mean that different drains have same widths in the arrangement direction of the word lines. The same source sizes at least mean that different sources have same widths in the arrangement direction of the word lines. The width direction is the same as the arrangement direction of the word lines.

In some embodiments, in the arrangement direction of the word lines, the gate of the third transistor P3 is located between the gate of the fourth transistor P0 and the gate of the second transistor P2. Further, with same drain sizes of different transistors, the drain of the third transistor P3 is located between the drain of the fourth transistor P0 and the source of the second transistor P2. With same source sizes of different transistors, the source of the third transistor P3 is located between the source of the fourth transistor P0 and the drain of the second transistor P2.

In some embodiments, gates of adjacent transistors are different portions of a same conductive layer. In the embodiment of the present application, different PMOS transistors in the word line driver array share the same conductive layer, namely gates of different transistors are different portions of the same conductive layer. The conductive layer may be of a single-layer structure or a multi-layer structure. The material of the conductive layer includes at least one of metal, a metal compound or a doped semiconductor. The metal includes tantalum or tungsten. The metal compound includes titanium nitride. The doped semiconductor includes doped polycrystalline silicon.

In the embodiment of the present application, the conductive layer is located on a side of the drain of the transistor facing toward the source as well as on another two opposite sides of the drain. In addition, if the source partially coincides with the adjacent drain in the second direction D2, or the source is close to the adjacent drain in the first direction D1, for example, the source of the third transistor P3 and the drain of the fourth transistor P0, and the drain of the third transistor P3 and the source of the fourth transistor P0, the shared conductive layer further extends to a portion therebetween, so as to suppress the electronic crosstalk between adjacent active regions, and ensure the desirable electrical properties of the word line driver array.

In the embodiment of the present application, based on the first transistor P1, the third transistor P3 is equivalent to a reproduction of the first transistor P1 with an adjusted source-drain orientation; and by moving the overall positions by a certain distance along a third direction D3, the drain of the third transistor P3 is located between the drain and source of the first transistor P1 in the third direction D3. Further, based on the first transistor P1 and the third transistor P3, the fourth transistor P0 and the second transistor P2 are equivalent to reproductions of the first transistor P1 and the third transistor P3; and by moving the overall positions by a certain distance along the third direction D3, the source of the fourth transistor P0 is located between the source of the first transistor P1 and the drain of the third transistor P3 in the third direction D3.

In the embodiment of the present application, in an arrangement direction of the transistors, a width of a source of a transistor is greater than a width of a drain of the transistor, a width direction being the same as an arrangement direction of the transistors. As can be seen from FIG. 2, the conductive layer is not around the source of the transistor. In the arrangement direction of the transistors, namely the first direction D1, the source has an adjustable width. By adjusting the width of the source, stress distribution of a region neighboring to the source can be adjusted to prevent influences from stress concentration on properties of the word line driver array.

In some embodiments, sources of different transistors are staggered in the arrangement direction of the transistors. Referring to FIG. 2, with adjacent first transistor P1 and third transistor P3 as an example, the source of the first transistor P1 and the source of the third transistor P3 are staggered in the first direction D1. In other embodiments, the source of the first transistor P1 and the source of the third transistor P3 at least partially coincide in the first direction D1.

In the embodiment of the present application, the fourth word line, the first word line, the second word line and the third word line are parallel to each other. The present application can prepare different word lines with a same mask and a same process to reduce the number of masks and the process difficulty, or prepares the word lines at the same time with a mask having a parallel opening pattern to reduce the difficulty in preparing the mask, improve the process yield and lower the process cost. In addition, by providing adjacent word lines in parallel, the present application prevents the short circuit between the adjacent word lines, achieves more uniform stress distribution between the adjacent word lines, prevents influences from stress concentration on properties of the transistors in the word line driver, and ensures the satisfactory electrical properties and high stability of the word lines and the word line driver array.

Accordingly, an embodiment of the present application further provides a memory, including a plurality of the word line driver arrays arranged sequentially, where an arrangement direction of the word line driver arrays is the same as that of corresponding word lines.

Figure 3:
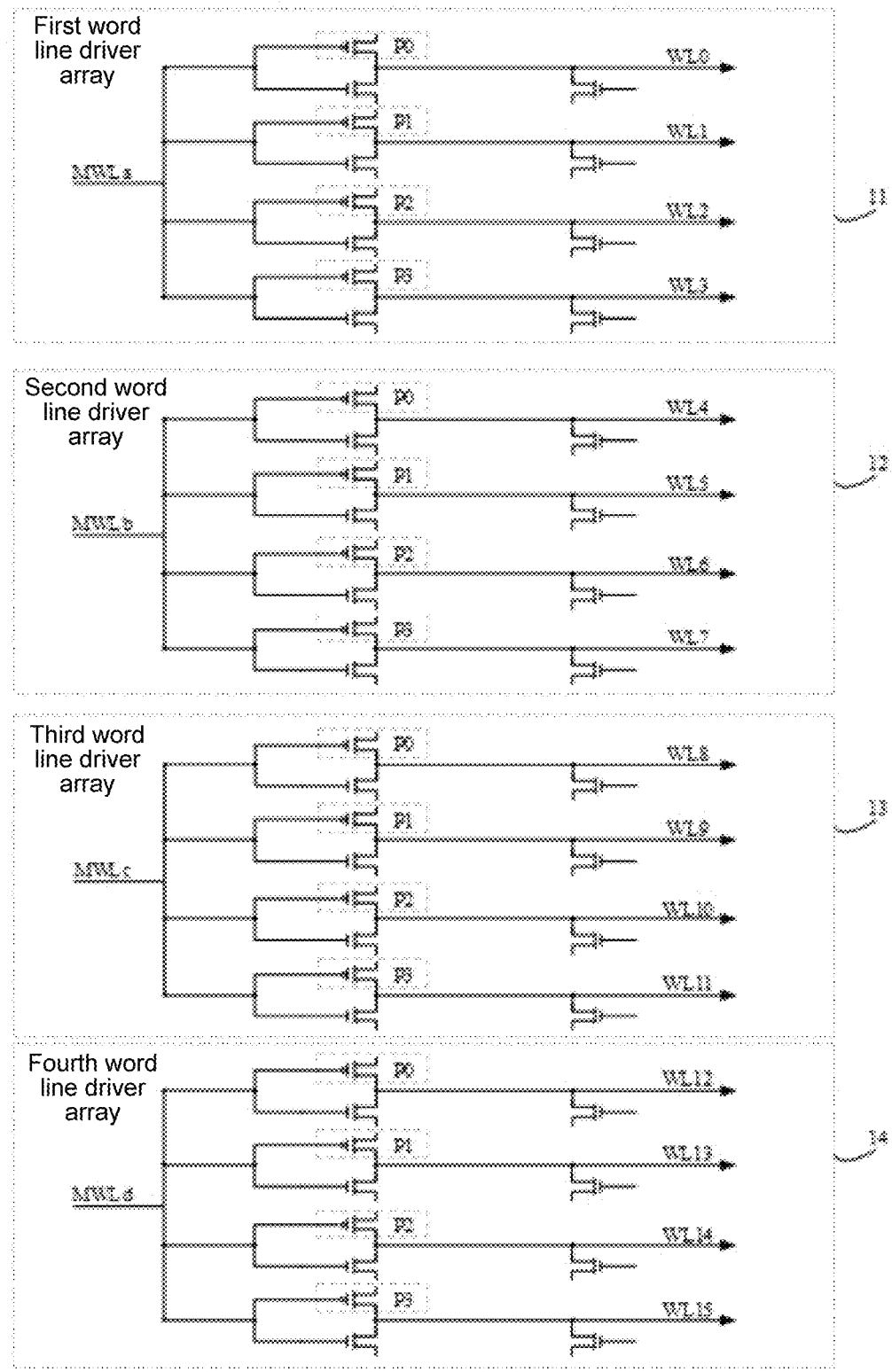
FIG. 3 is a schematic diagram of a circuit structure of a memory according to an embodiment of the present application.
Figure 4:
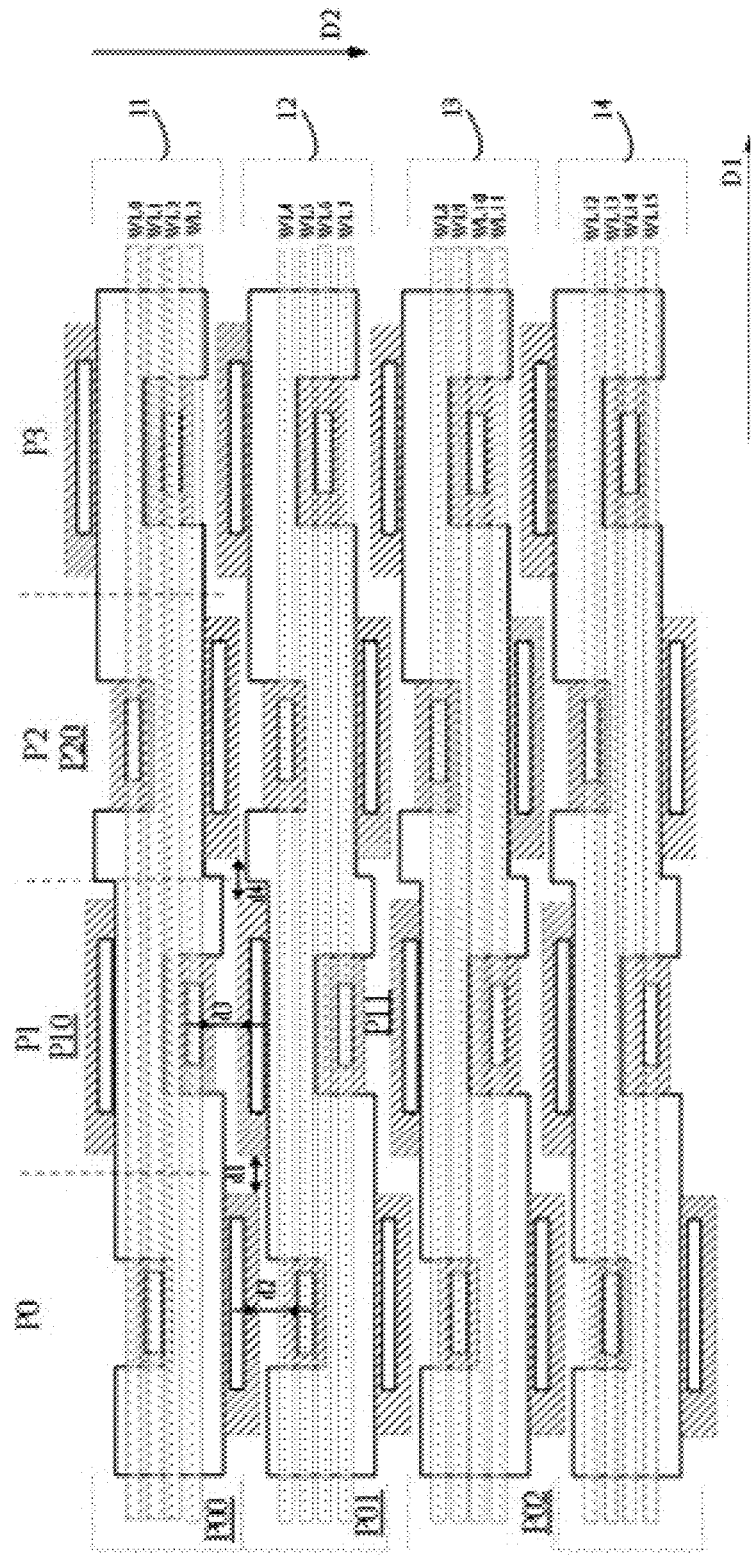
FIG. 4 is a schematic diagram of a layout structure of a memory according to an embodiment of the present application.

FIG. 3 is a schematic diagram of a circuit structure of a memory according to an embodiment of the present application. FIG. 4 is a schematic diagram of a layout structure of a memory according to an embodiment of the present application.

Referring to FIG. 3 and FIG. 4, exemplarily, the memory includes a first word line driver array 11, a second word line driver array 12, a third word line driver array 13 and a fourth word line driver array 14. Different word line driver arrays are structurally the same. The word line driver arrays each include the first transistor P1, the third transistor P3, the fourth transistor P0 and the second transistor P2 sequentially arranged, as well as a plurality of word lines parallel to each other. Different word line driver arrays are connected to different word lines.

Specifically, the first word line driver array 11, the second word line driver array 12, the third word line driver array 13 and the fourth word line driver array 14 are connected to different word lines sequentially arranged. The first word line driver array 11 is connected to a fourth word line WL0, a first word line WL1, a second word line WL2 and a third word line WL3. The second word line driver array 12 is connected to a fifth word line WL4, a sixth word line WL5, a seventh word line WL6 and an eighth word line WL7. The third word line driver array 13 is connected to a ninth word line WL8, a tenth word line WL9, an eleventh word line WL10 and a twelfth word line WL11. The fourth word line driver array 14 is connected to a thirteenth word line WL12, a fourteenth word line WL13, a fifteenth word line WL14 and a sixteenth word line WL15.

In addition, different word line driver arrays are configured to receive different control signals. Specifically, the first word line driver array 11 is configured to receive a first control signal MWLa, the second word line driver array 12 is configured to receive a second control signal MWLb, the third word line driver array 13 is configured to receive a third control signal MWLc, and the fourth word line driver array 14 is configured to receive a fourth control signal MWLd. It is to be understood that the different control signals received by the different word line driver arrays have the same types and different parameters.

In some embodiments, referring to FIG. 4, the direction in which the word lines of the memory extend is the first direction D1, and the arrangement direction of different word line driver arrays is the second direction D2. The first word line driver array 11 includes a fourth transistor P00, a tenth transistor P10 and a twentieth transistor P20. The second word line driver array 12 includes a first transistor P01 and an eleventh transistor P11. The third word line driver array 13 includes a second transistor P02. The P00, the P10 and the P20 are arranged along the first direction D1. The P01 and the P11 are arranged along the first direction D1. The P00, the P01 and the P02 are arranged along the second direction D2. The P10 and the P11 are arranged along the second direction D2. In the second direction D2, the source of the P00 at least partially coincides with the source of the P11, the source of the P11 at least partially coincides with the source of the P20, and the source of the P11 is located between the source of the P00 and the source of the P20.

The first spacing d1 between the source of the P00 and the source of the P11 in the first direction D1 is the same as the second spacing d2 between the source of the P00 and the drain of the P01 in the second direction D2, the third spacing d3 between the drain of the P10 and the source of the P11 in the second direction D2, and the fourth spacing d4 between the source of the P11 and the source of the P20 in the first direction D1. In other words, the spacing between any source and the adjacent source in the first direction D1 is the same as that between the any source and the drain of the opposite transistor in the second direction D2. The term "opposite" means that two transistors face toward each other without other transistors therebetween. For example, the source of the P00 and the drain of the P01 are opposite, the drain of the P10 and the source of the P11 are opposite, and the source of the P00 and the source of the P02 are opposite.

By controlling positions of transistors in the different word line driver arrays, stresses in different directions of active regions of the transistors are the same or similar, thereby preventing influences from the stress concentration on electrical properties of the active regions and ensuring desirable electrical information of the memory. The stress concentration may arise from shallow trench isolation (STI) structures having different thicknesses in different directions. When the STI structures apply stresses to the active regions, the active regions and trenches may deform, such that electrical properties of corresponding transistors are far from satisfactory and different transistors have different electrical properties, namely there is a lack of stability. In addition, due to the stress concentration, there may be cracks in the active regions and poor contacts between the active regions and the contact holes, causing conductive defects of the transistors.

In the embodiment of the present application, different word lines in the memory are parallel to each other. The present application can prepare different word lines with a same mask and a same process to reduce the number of masks and the process difficulty, or prepares the word lines at the same time with a mask having a parallel opening pattern to reduce the difficulty in preparing the mask, improve the process yield and lower the process cost. In addition, by providing adjacent word lines in parallel and controlling adjacent word line driver arrays according to the described positional relationship, the present application prevents the stress concentration in the memory and influences of the stress concentration on the electrical properties of the memory.

Those of ordinary skill in the art can understand that the above implementations are specific embodiments for implementing the present application. In practical applications, various changes may be made to the above embodiments in terms of form and details without departing from the spirit and scope of the present application. Any person skilled in the art may make changes and modifications to the embodiments without departing from the spirit and scope of the present disclosure. Therefore, the protection scope of the present disclosure should be subject to the scope defined by the claims.

The invention claimed is:

1. A word line driver array, comprising:
a first transistor, a third transistor, a fourth transistor and a second transistor arranged sequentially, as well as a fourth word line, a first word line, a second word line and a third word line parallel to each other, wherein the fourth word line is connected to a drain of the fourth transistor, the first word line is connected to a drain of the first transistor, the second word line is connected to a drain of the second transistor, and the third word line is connected to a drain of the third transistor; and
wherein a direction that a source of a transistor faces toward a drain of the transistor is recorded as a source-drain orientation of the transistor, and source-drain orientations of adjacent transistors are opposite; and
wherein gates of the adjacent transistors are at least partially staggered in an arrangement direction of word lines; and two drains of the adjacent transistors are located between two corresponding sources in the arrangement direction of the word lines; and
wherein in the arrangement direction of the word lines, the drain of the third transistor is located between the drain of the first transistor and a source of the first transistor, and the drain of the first transistor is located between a source of the third transistor and the drain of the third transistor.

2. The word line driver array according to claim 1, wherein the fourth word line, the first word line, the second word line and the third word line each are a straight line.

3. The word line driver array according to claim 2, wherein drains of the adjacent transistors are staggered in the arrangement direction of the word lines.

4. The word line driver array according to claim 2, wherein drains of different transistors arranged at an interval are staggered in the arrangement direction of the word lines.

5. The word line driver array according to claim 1, wherein the first word line is located between the fourth word line and the third word line.

6. The word line driver array according to claim 1, wherein the second word line is located between the first word line and the third word line.

7. The word line driver array according to claim 1, wherein in the arrangement direction of the word lines, a gate of the fourth transistor is located between a gate of the first transistor and a gate of the third transistor.

8. The word line driver array according to claim 7, wherein in the arrangement direction of the word lines, the drain of the fourth transistor is located between the drain of the first transistor and the source of the third transistor, and a source of the fourth transistor is located between the source of the first transistor and the drain of the third transistor.

9. The word line driver array according to claim 1, wherein in the arrangement direction of the word lines, a gate of the third transistor is located between a gate of the fourth transistor and a gate of the second transistor.

10. The word line driver array according to claim 9, wherein in the arrangement direction of the word lines, the source of the third transistor is located between the drain of the fourth transistor and a source of the second transistor, and the drain of the third transistor is located between a source of the fourth transistor and the drain of the second transistor.

11. The word line driver array according to claim 1, wherein the gates of the adjacent transistors are different portions of a same conductive layer.

12. The word line driver array according to claim 1, wherein in an arrangement direction of transistors, a width of the source of the transistor is greater than a width of the drain of the transistor.

13. A memory, comprising a plurality of the word line driver arrays arranged sequentially according to claim 1, wherein an arrangement direction of the word line driver arrays is the same as the arrangement direction of the word lines.

14. A word line driver array, comprising:

a first transistor, a third transistor, a fourth transistor and a second transistor arranged sequentially, as well as a fourth word line, a first word line, a second word line and a third word line parallel to each other, wherein the fourth word line is connected to a drain of the fourth transistor, the first word line is connected to a drain of the first transistor, the second word line is connected to a drain of the second transistor, and the third word line is connected to a drain of the third transistor; and wherein a direction that a source of a transistor faces toward a drain of the transistor is recorded as a source-drain orientation of the transistor, and source-drain orientations of adjacent transistors are opposite; and wherein gates of the adjacent transistors are at least partially staggered in an arrangement direction of word lines; and wherein in the arrangement direction of the word lines, a gate of the third transistor is located between a gate of the fourth transistor and a gate of the second transistor; and wherein in the arrangement direction of the word lines, a source of the third transistor is located between the drain of the fourth transistor and a source of the second transistor, and the drain of the third transistor is located between a source of the fourth transistor and the drain of the second transistor.

\* \* \* \* \*